(12) United States Patent
Nagaraj et al.

(10) Patent No.: US 9,112,527 B2
(45) Date of Patent: Aug. 18, 2015

(54) DIGITAL-TO-ANALOG SINUSOIDAL DRIVER APPARATUS, SYSTEMS AND METHODS

(71) Applicant: TEXAS INSTRUMENTS INCORPORATED, Dallas, TX (US)

(72) Inventors: Sudhir Nagaraj, Dallas, TX (US); Anuj Jain, Irving, TX (US); Wenchao Qu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 54 days.

(21) Appl. No.: 14/135,517

(22) Filed: Dec. 19, 2013

(65) Prior Publication Data

US 2015/0015176 A1 Jan. 15, 2015

Related U.S. Application Data

(60) Provisional application No. 61/844,770, filed on Jul. 10, 2013.

(51) Int. Cl.
*H03M 1/66* (2006.01)
*G06G 7/22* (2006.01)
*H02P 8/22* (2006.01)

(52) U.S. Cl.
CPC ............... *H03M 1/661* (2013.01); *G06G 7/22* (2013.01); *H02P 8/22* (2013.01)

(58) Field of Classification Search
CPC .................................. H03M 1/66; G06G 7/22

USPC ............ 341/144, 147; 327/129; 708/811, 845
See application file for complete search history.

(56) References Cited

U.S. PATENT DOCUMENTS

| | | | | |
|---|---|---|---|---|
| 3,183,342 | A * | 5/1965 | Wortzman | 341/144 |
| 3,688,098 | A * | 8/1972 | Cwynar et al. | 708/811 |
| 5,132,636 | A * | 7/1992 | Hori | 327/129 |
| 7,423,460 | B2 * | 9/2008 | Wang | 327/129 |
| 2013/0177161 | A1 | 7/2013 | Yokoyama | |

FOREIGN PATENT DOCUMENTS

JP            02118784 A  *  5/1990

* cited by examiner

*Primary Examiner* — Howard Williams
(74) *Attorney, Agent, or Firm* — Alan A. R. Cooper; Frank D. Cimino

(57) ABSTRACT

Input codes are sequenced at a lower-resolution linear DAC and the output is converted to a linear current waveform. A first of two interconnected analog current multipliers multiplies the linear current by itself and by the inverse of a first constant current source to create a quadratic current output. A second current multiplier multiplies the quadratic output current by the linear current and by the inverse of a second constant current source to generate a cubic current output. The quadratic and cubic currents are subtracted from the linear current to generate an approximation of the first 180 degrees of a sine wave current. Alternate (pi to 2*pi) positive-going one-half sine waves may be polarity reversed to create a complete positive-going and negative-going sine-shaped electrical current of higher resolution than is available from a sine DAC of resolution equivalent to that of the lower-resolution linear DAC.

20 Claims, 5 Drawing Sheets

DIGITAL-TO-ANALOG SINUSOIDAL DRIVER APPARATUS, SYSTEMS AND METHODS

PRIORITY CLAIM

This application claims the benefit of priority under 35 U.S.C. §119(e) to U.S. Provisional Patent Application Ser. No. 61/844,770 titled "A New Method for Implementing 8-bit Sinusoidal DAC Using 8-bit Linear DAC for Micro-stepper Motors," filed on Jul. 10, 2013 and incorporated herein by reference in its entirety.

TECHNICAL FIELD

Structures and methods described herein relate to digital-to-analog (DAC) conversion, including implementation of a sinusoidal DAC.

BACKGROUND INFORMATION

An output waveform generated by a DAC is required by many applications to be a linear function of a digital code appearing at the DAC input. Indeed, the degree of such linearity is often considered to be a quality of merit of the DAC. For digitized music and other audio applications, for example, non-linearities in a DAC output may cause artifacts perceivable by the human ear as distortion.

However, other shapes of DAC output waveforms may be better suited to other applications. Another output waveform shape that may be desirable is that of a sine or cosine waveform. In bipolar stepper motors, for example, motor position is controlled by regulating the current in two motor windings, one such winding beginning at a position of 90 degrees from the other. For a smooth motion profile, the currents in the two windings are regulated in a sine and cosine fashion with respect to each other. For regulating this current, a sinusoidal reference voltage is generated using a sinusoidal DAC. A stepper motor is simply an example, however; any application requiring a sinusoidal waveform may use a sinusoidal DAC to generate the waveform digitally.

As the sinusoidal waveforms flatten out (e.g., as dv/dt approaches zero from any of the four quadrants), the step resolution required to accurately reproduce the sinusoidal waveform at that level is much higher as compared to the step resolution needed for a larger dv/dt that exists when the waveform is close to zero. In the case of an 8-bit sinusoidal DAC used in a bipolar stepper motor application, for example, the step resolution needed at the top is approximately 0.007 percent. When the winding current is close to zero, however, the resolution requirement significantly relaxes to approximately 1.2 percent for first step. Thus, in the example case of a bipolar stepper motor application, an 8-bit sine DAC required for 256-level micro stepping will have 1.2 percent of full scale as the biggest step size and 0.007 percent of full scale as the smallest step size. A 12-bit or higher linear DAC together with steering logic to select the input bit combinations resulting in a sinusoidal output would be required to achieve such a high dynamic range of resolution. The latter method wastes many bit combinations, may be significantly area intensive, and may require a high degree of layout precision and effort.

SUMMARY OF THE INVENTION

Apparatus, systems and methods disclosed herein generate a one-half period sinusoidal waveform using a set of linear currents operated on by two interconnected analog current multipliers and a summing junction/device. The waveform is of the shape:

$$\text{approximation of }\sin(x)=x-A^{*}x^{2}-A^{*}B^{*}x^{3}$$

In some embodiments, the linear currents are generated by a linear DAC driving a transconductance amplifier. However, other methods of generating the linear current waveform points may be utilized. Subsequent examples herein may include an 8-bit linear DAC. However, linear DACs of various resolutions and built using various technologies may be used to implement embodiments herein. The sinusoidal output voltages and currents of these embodiments may be used to drive a bipolar stepper motor or other circuits and devices requiring sinusoidal waveforms.

Apparatus and methods herein may generate a linear voltage shape corresponding to the first quadrant (first 90 degrees) of a sinusoidal waveform using an 8-bit linear DAC and ramping up the input code from zero to 255. For the second quadrant, DAC input codes may be ramped down from 255 to zero to create a linear voltage shape characterized by a negative slope. A transconductance amplifier and an optional set of current mirrors convert these linear voltage waveforms to linear current waveforms I(c), where the index (c) refers to the DAC input code.

The first current multiplier multiplies I(c) by itself and by the inverse magnitude of a first tuned constant current source IA to generate a quadratic output current $[I(c)]^{2}/IA$. The second current multiplier multiplies the quadratic output current $[I(c)]^{2}/IA$ by I(c) and by the inverse magnitude of a second tuned constant current source IB to generate a cubic output current $[I(c)]^{3}/(IA^{*}IB)$. The quadratic and cubic output currents are subtracted from the linear current I(c) to generate the one-half sine current output approximation:

$$I\_OUT(c)=I(c)-\{[I(c)]^{2}/IA\}-\{[I(c)]^{3}/(IA^{*}IB)\}$$

The output current I_OUT(c) is converted to a reference voltage waveform V_OUT(c). In some embodiments, a phase sequencer generates a drive current from V_OUT(c) and reverses the polarities of current values in the third and fourth quadrants of the drive current waveform to create a full sine wave driver current waveform.

DETAILED DESCRIPTION

Figure 1:
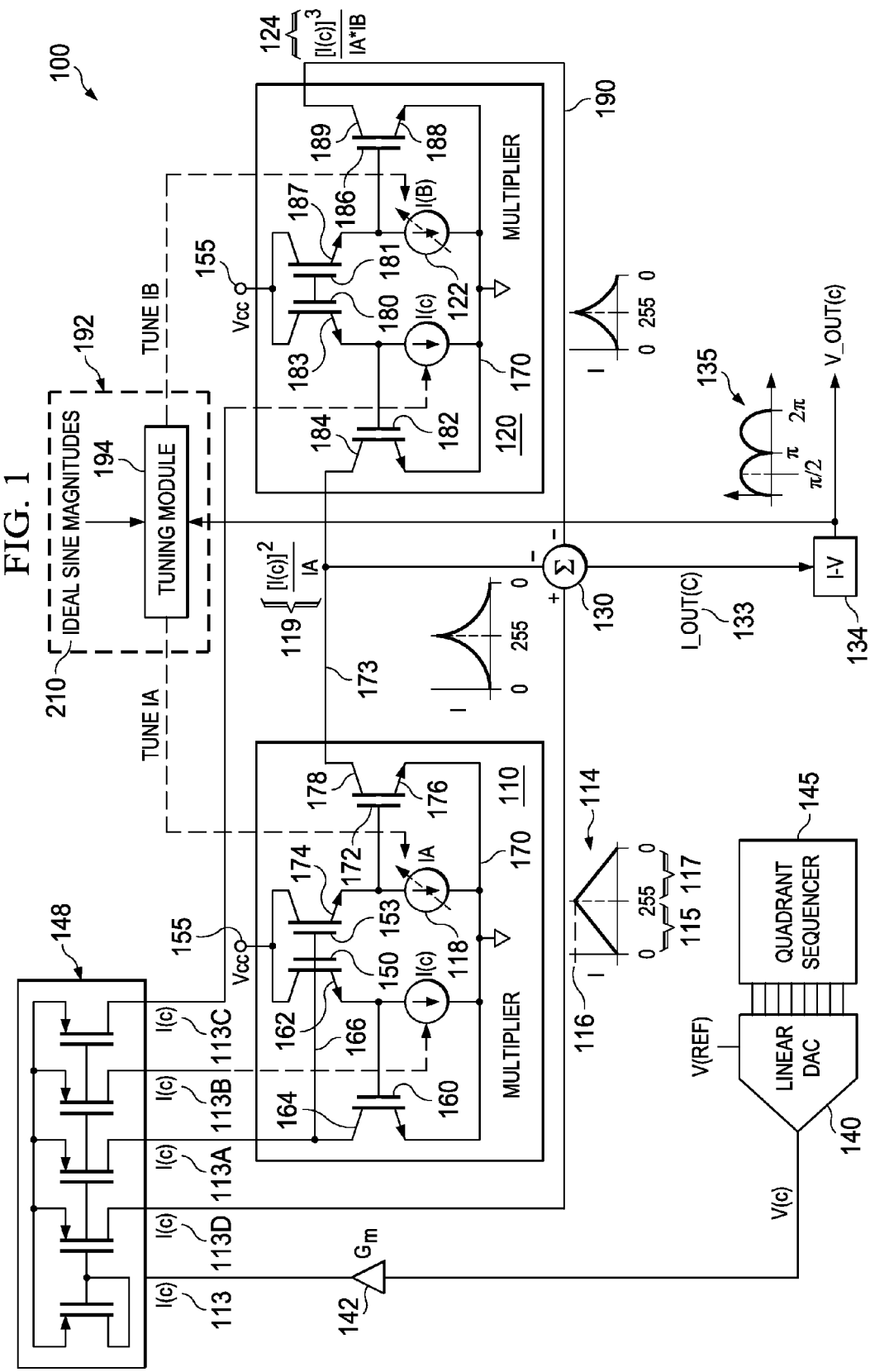
FIG. 1 is a schematic diagram of a one-half sinusoidal driver apparatus according to various example embodiments of the invention.

FIG. 1 is a schematic diagram of a one-half sinusoidal driver apparatus 100 according to various example embodiments of the invention. The apparatus 100 includes a first analog current multiplier 110. The first analog current multiplier 110 accepts a set of linearly time-related analog currents I(c) 113A and 113B. As shown in the inset graph 114, each of the linear currents I(c) 113A and 113B increases in magnitude over a period of time 115 from zero to a maximum magnitude 116 and then decreases in magnitude over an equal period of time 117 from the maximum magnitude to zero. The first current multiplier 110 multiplies a magnitude of each I(c) by itself and by the inverse of a magnitude of a first constant current source IA 118 to generate a first multiplier output current value $\{[I(c)]^2/IA\}$ 119. The first multiplier output current value $\{[I(c)]^2/IA\}$ 119 is generated for each corresponding I(c) 113A as the index (c) changes.

The apparatus 100 also includes a second analog current multiplier 120 coupled to the first analog current multiplier 110. The second analog current multiplier 120 multiplies each first multiplier output current $\{[I(c)]^2/IA\}$ 119 by each linear current value I(c) 113C and by an inverse of a magnitude of a second constant current source IB 122 to generate a second set of multiplier output current values $\{[I(c)]^3/(IA*IB)\}$ 124, one for each corresponding I(c) 113C as the index value (c) changes. Values of the constant current sources IA 118 and IB 122 may be determined during the manufacturing testing process for a particular device incorporating the apparatus 100 as further described below.

The apparatus 100 further includes a summing junction 130 coupled to the first and second multipliers 110 and 120. The summing junction 130 subtracts each first multiplier output current $\{[I(c)]^2/IA\}$ 119 and each second multiplier output current $\{[I(c)]^3/(IA*IB)\}$ 124 from the corresponding linear current I(c) 113D to generate a set of output currents I_OUT(c) 133. The apparatus 100 may also include a current-to-voltage converter 134 coupled to the summing junction 130. The current-to-voltage converter 134 converts the set of currents I_OUT(c) 133 to a corresponding set of output voltages V_OUT(c) in the shape of a one-half sinusoidal electrical drive current 135.

In some embodiments, the linear currents I(c) 113A, 113B, 113C, and 113D are generated in stepped fashion using a linear DAC 140 coupled to a transconductance amplifier 142. In some embodiments, the linear DAC may be a string ladder DAC, a thermometer DAC, or other type of DAC with a linear output. The linear DAC may be an 8-bit DAC to generate 256 voltage levels including zero volts as shown in examples herein. However, an 8-bit linear DAC is used herein merely as an example. Some embodiments of the apparatus 100 may use linear DACs of resolutions other than 8-bit.

The transconductance amplifier 142 converts each V(c) to a corresponding linear electrical current I(c) 113. Some embodiments of the apparatus 100 may also include a current mirror module 148 coupled to the transconductance amplifier 142. The current mirror module 148 generates current inputs 113A, 113B to the first analog current multiplier 110. The current mirror module 148 also generates current input 113C to the second analog current multiplier 120. The current mirror module 148 further generates input current 113D to the summing block 130 as described above. It is noted that the input currents 113A, 113B, 113C, and 113D may be of the same magnitude as the output current 113 of the transconductance amplifier 142. In some embodiments, however, the input currents 113A, 113B, 113C and 113D may be linearly factored by the current mirror module 148 to be different values than the magnitude of the output current 113 of the transconductance amplifier 142.

In some embodiments, the apparatus 100 also includes a quadrant sequencer 145 coupled to the linear DAC 140. The quadrant sequencer 145 generates a set of DAC input codes sequentially, at equally-spaced times. The linear DAC accepts the set of input codes in increasing numerical sequence starting with a code to generate a smallest output voltage magnitude V(0) and ending with a code to generate a largest output voltage magnitude "V(Max_DAC_Code)". The quadrant sequencer 145 subsequently presents the set of input codes in decreasing numerical sequence starting with the code to generate V(Max_DAC_Code) and ending with the code to generate V(0). Each code is presented at an equal time period from a previously-presented code. A magnitude of each DAC output voltage is referred to as V(DAC_Code) "V(c)". A graph of V(c) over time is of the same shape as the graph 114 of I(c) 113D.

Operation of the first and second current multipliers 110 and 120, respectively, was described above. Returning now to that discussion, structures associated with example embodiments of the multipliers 110 and 120 will now be described. The first analog current multiplier 110 includes a base-coupled pair of NPN bipolar transistors 150 and 153. The bipolar transistors 150 and 153 are collector-coupled to a positive voltage rail 155.

The first current multiplier 110 also includes an input NPN bipolar transistor 160 base-coupled to an emitter terminal 162 of the transistor 150. The collector 164 of the transistor 160 is coupled to the base terminal connection 166 of the transistor pair 150 and 153. Each value of analog input current I(c) 113A is received at the collector terminal 164 of the transistor 160 and at the base terminal connection 166 of the transistor pair 150 and 153. The input current source I(c) 113B is coupled between the emitter terminal 162 of the transistor 150 and a ground rail 170.

The first current multiplier 110 also includes an output NPN bipolar transistor 172 base-coupled to an emitter terminal 174 of the transistor 153. An emitter terminal 176 of the output bipolar transistor 172 is coupled to the ground rail 170. A collector terminal 178 of the output bipolar transistor 172 provides an output terminal 173 from the first current multiplier 110. The tuned constant-current source IA 118 is coupled between the emitter terminal 174 of the transistor 153 and the ground rail 170.

The second analog current multiplier 120 includes a base-coupled pair of NPN bipolar transistors 180 and 181. The bipolar transistors 180 and 181 are collector-coupled to the positive voltage rail 155. The first current multiplier 110 also includes an input NPN bipolar transistor 182 base-coupled to an emitter terminal 183 of the transistor 180. The collector terminal 184 of the transistor 182 is coupled to the output terminal 173 of the first current multiplier 110 as an input to the second current multiplier 120. Each value of output current 119 from the first current multiplier is received at the collector terminal 184 of the transistor 182. The input current source I(c) 113C is coupled between the emitter terminal 183 of the transistor 180 and the ground rail 170.

The second current multiplier 120 also includes an output NPN bipolar transistor 186 base-coupled to an emitter terminal 187 of the transistor 181. An emitter terminal 188 of the output bipolar transistor 186 is coupled to the ground rail 170. A collector terminal 189 of the output bipolar transistor 186 feeds an output terminal 190 from the second current multiplier 120. The tuned constant-current source IB 122 is coupled between the emitter terminal 187 of the transistor 181 and the ground rail 170.

Figure 2:
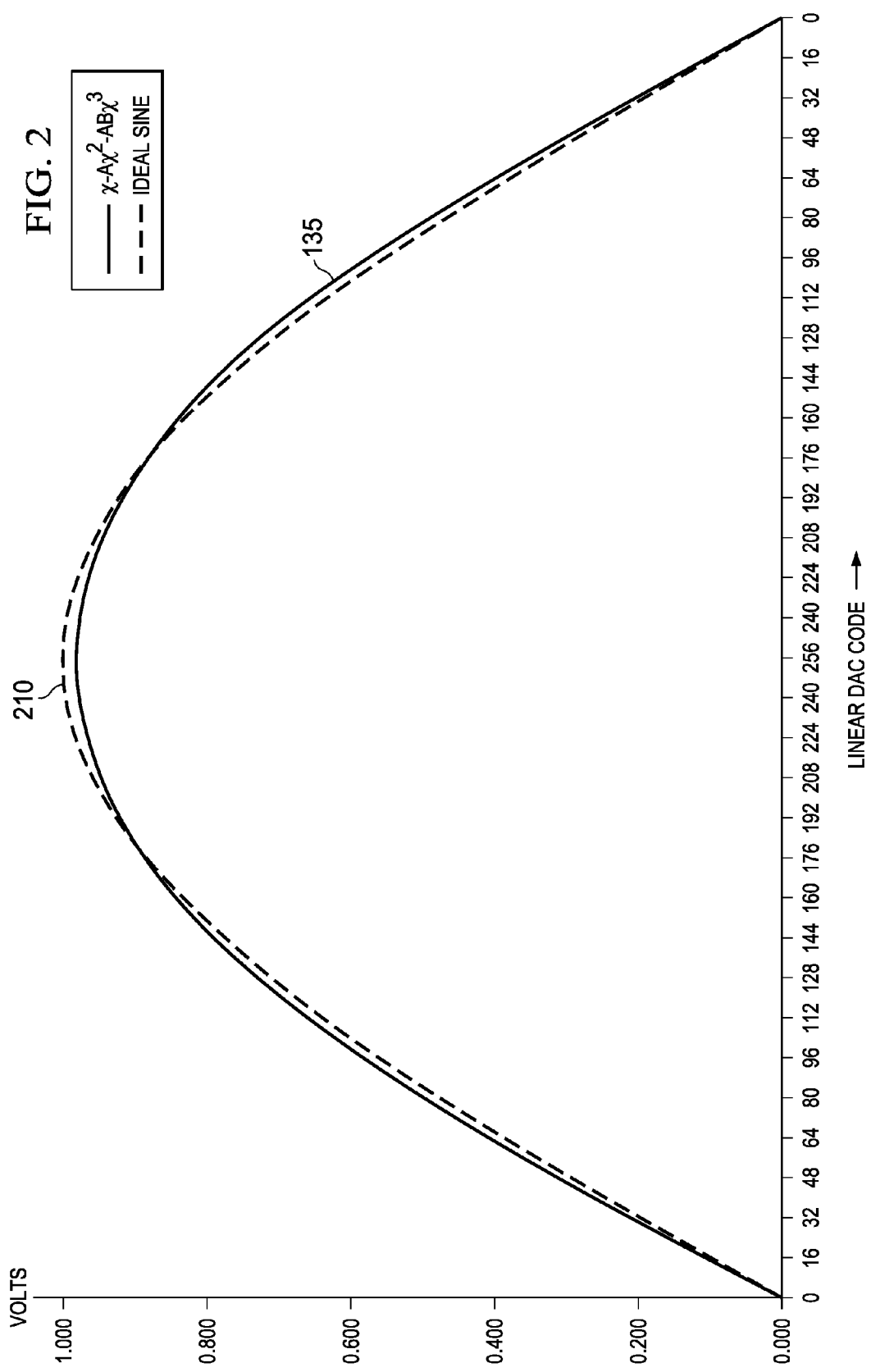
FIG. 2 is a waveform diagram illustrating the result of a constant current source tuning apparatus on an output waveform shape according to various example embodiments.

FIG. 2 is a waveform diagram illustrating the result of an automatic test equipment (ATE) constant current source tuning apparatus 192 (FIG. 1) on the shape of an output waveform 135 (FIGS. 1 and 2) according to various example embodiments. It is noted that the vertical axis of the waveform diagram of FIG. 2 is normalized to 1.0 volts. The apparatus 100 may include a tuning module 194 communicatively coupled to the constant current sources 118 and 122. At device manufacturing time or at some time in the future, the ATE 194 may be used to tune the constant current sources 118 and/or 122. The tuning module 194 compares various magnitudes of V_OUT(c) 135 to corresponding values from a mathematically-determined sinusoidal waveform 210 of a desired periodicity and maximum magnitude. The tuning module 194 adjusts the first and second constant current sources IA 118 and IB 122, respectively, using a curve-fitting method. The shape of V_OUT(c) 135 is curve-fitted to the mathematically-determined sinusoidal waveform 210.

Figure 3:
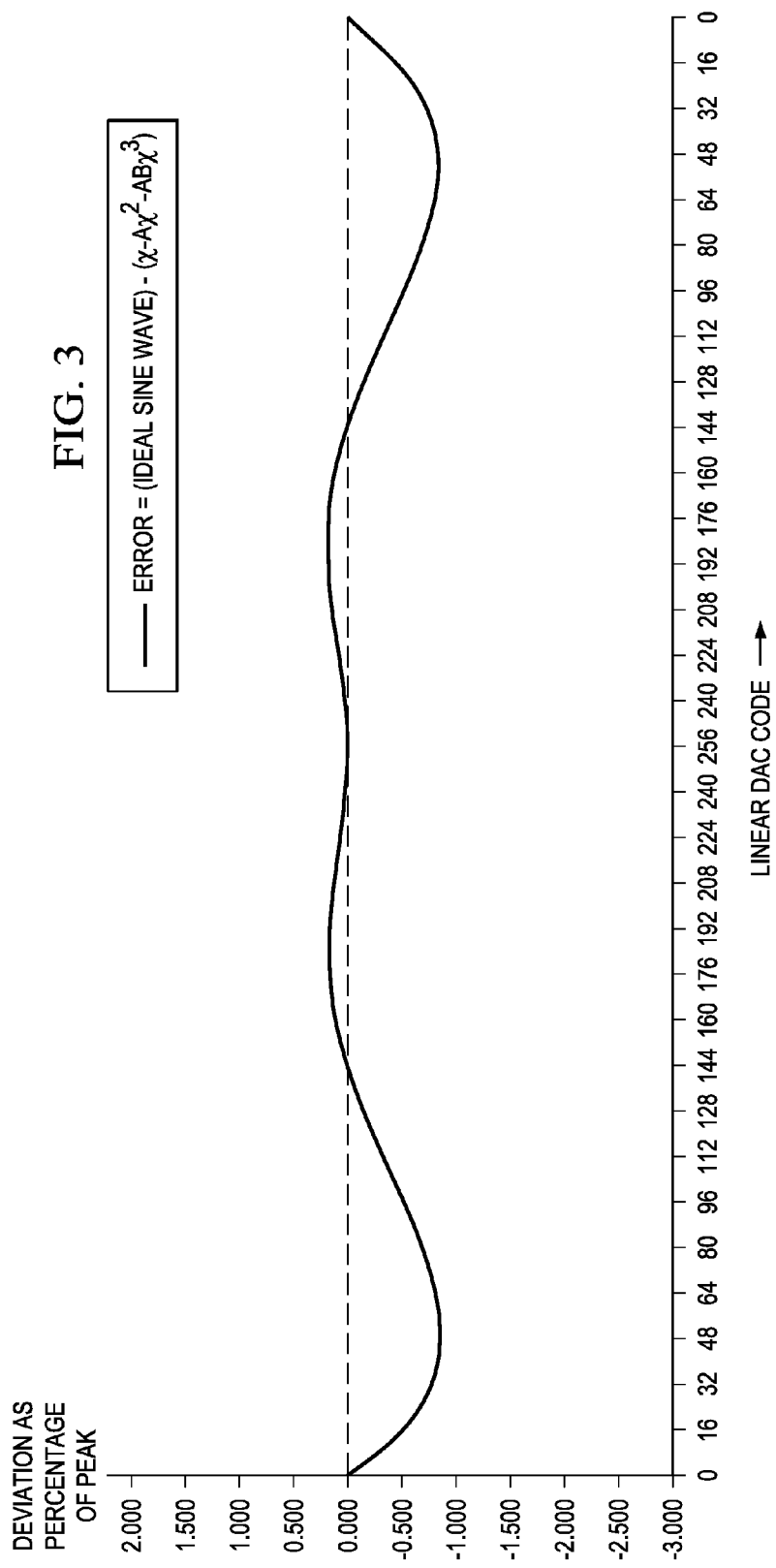
FIG. 3 is a diagram illustrating deviations of drive current output from a one-half sinusoidal driver apparatus as compared to an ideal sine curve as a percentage of peak output current.

FIG. 3 is a diagram illustrating deviations of voltage output V_OUT(c) 135 from the one-half sinusoidal driver apparatus 100 of FIG. 1 as compared to the ideal sine curve 210 as a percentage of the peak of the ideal sine curve 210. The apparatus 100 generates an output 135 that is within one percent of peak of the ideal sine curve 210.

Figure 4:
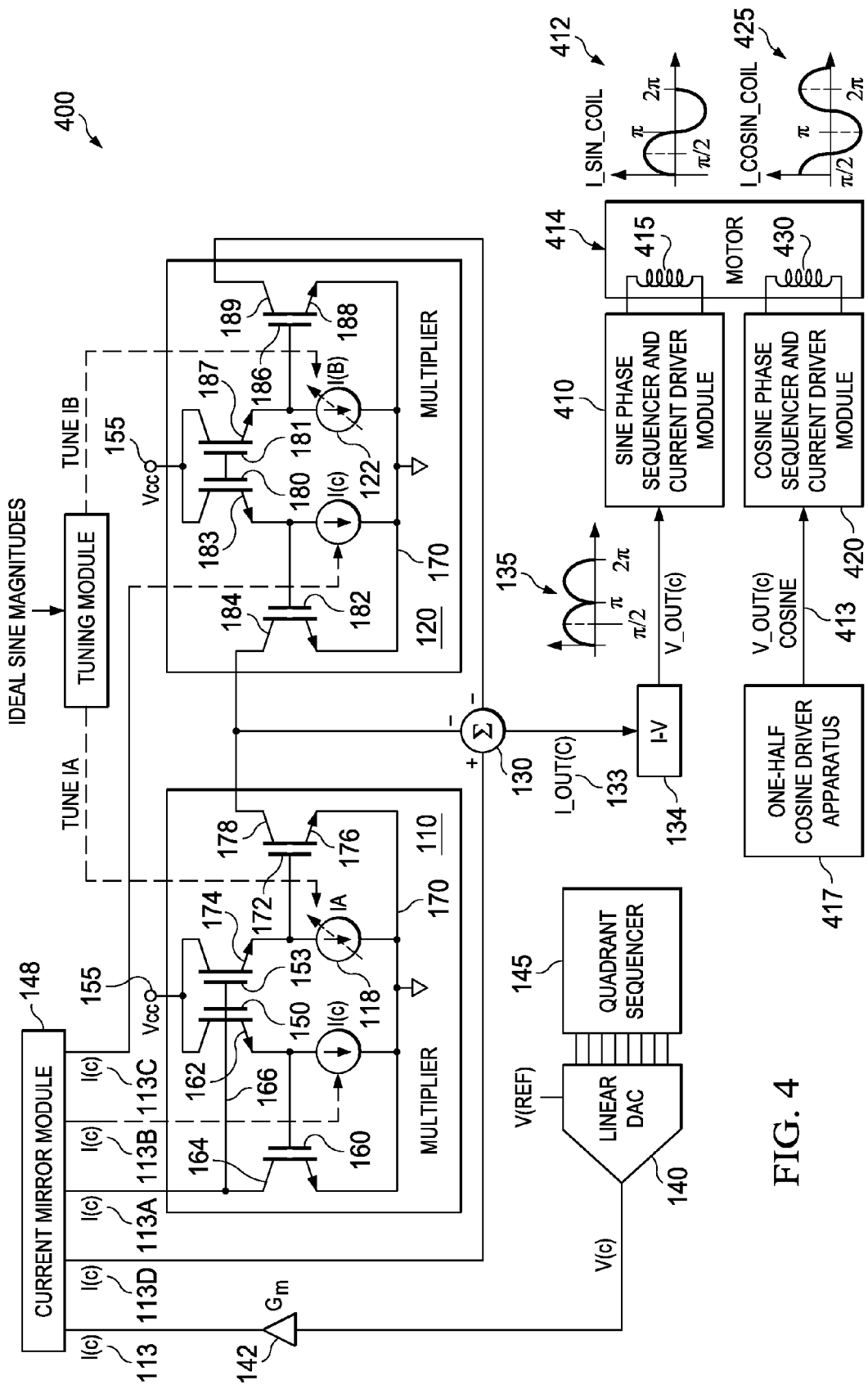
FIG. 4 is a schematic diagram of a stepper motor driver system according to various example embodiments.

FIG. 4 is a schematic diagram of a stepper motor driver system 400 according to various example embodiments. The stepper motor driver system 400 includes components of the driver apparatus 100, including first and second analog current multipliers 110 and 120, the summing junction 130, the current-to-voltage converter 134, the linear DAC 140, the transconductance amplifier 142, and the current mirror module 148, all coupled together to operate as described previously in the context of the apparatus 100 of FIG. 1.

The stepper motor driver system 400 also includes a sine phase sequencer and current driver module 410 coupled to the current-to-voltage converter 134. The sine phase sequencer and current driver module 410 generates a driver current 412 from V_OUT(c). The module 410 also reverses the polarity of current values each one-half sinusoidal interval (180 degrees) to generate the full positive and negative-going sinusoidal current waveform 412. The stepper motor driver system 400 further includes a bipolar stepper motor 414 communicatively coupled to the sine phase sequencer and current driver 410. A sinusoidal winding 415 of the bipolar stepper motor 414 receives and is driven by the sinusoidal coil driver current 412.

The system 400 duplicates the apparatus 100 as a one-half cosine driver apparatus 417. The apparatus 417 generates a cosine-shaped V_OUT(c) 413. The cosine equivalent of the apparatus 100 is sequenced with slightly different linear DAC inputs beginning with a highest DAC input code. The system 400 also includes a cosine phase sequencer and current driver module 420 coupled to the one-half cosine driver apparatus. The cosine phase sequencer and current driver module 420 generates a driver current 425 from the cosine-shaped V_OUT(c). The module 420 also reverses the polarity of driver current values each one-half sinusoidal interval (180 degrees) to generate the full positive and negative-going sinusoidal current waveform 425. The bipolar stepper motor 414 of the system 400 also includes a cosine winding 430 coupled to the cosine phase sequencer and current driver module 420. The cosine winding 430 receives and is driven by the cosine driver current 425.

Figure 5:
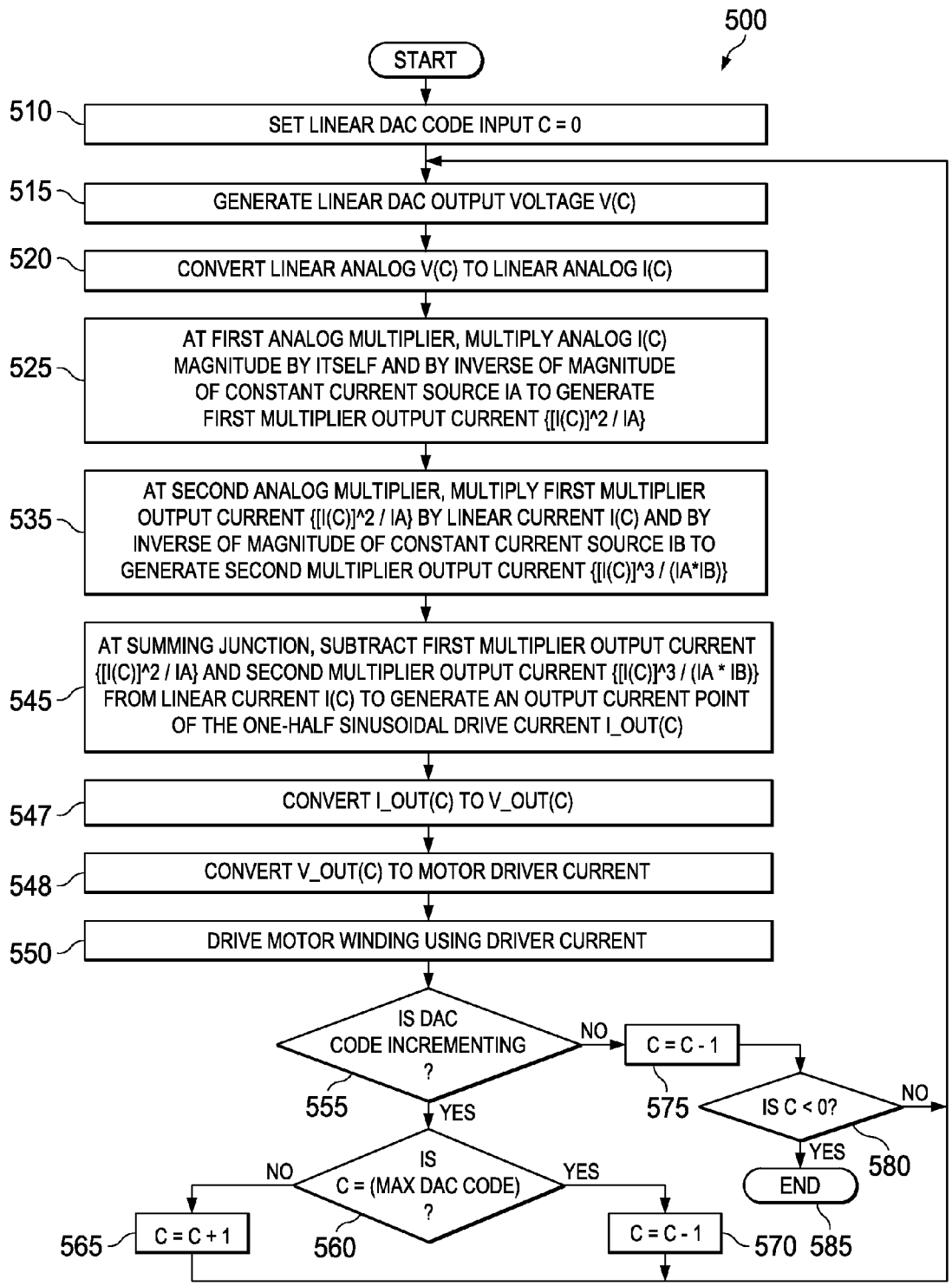
FIG. 5 is a flow diagram illustrating a method of generating a one-half sinusoidal waveform according to various example embodiments.

FIG. 5 is a flow diagram illustrating a method 500 of generating a one-half sinusoidal waveform according to various example embodiments. The method 500 includes presenting a set of input codes in increasing numerical sequence at an input to a linear DAC at regular intervals. Sequencing starts with a code to generate the smallest output voltage magnitude V(0) and ending with a code to generate the largest output voltage magnitude "V(Max_DAC_Code)". The sequencing also includes presenting the set of input codes in decreasing numerical sequence at the input to the linear DAC at regular intervals, starting with the code to generate V(Max_DAC_Code) and ending with a code to generate V(0). The magnitude of each DAC output voltage is referred to as V(DAC_Code) or simply "V(c)."

The method 500 commences at block 510 with setting the linear DAC code input C=0. The method 500 continues with generating an output voltage V(c) at the linear DAC, at block 515, and converting each V(c) to a corresponding linear electrical current I(c) at a transconductance amplifier, at block 520.

The method 500 also includes multiplying a magnitude of each I(c) by itself and by an inverse of a magnitude of a first constant current source IA, at block 525. The latter operation generates a first multiplier output current $\{[I(c)]^2/IA\}$.

The method 500 further includes multiplying each first multiplier output $\{[I(c)]^2/IA\}$ by the linear current I(c) and by an inverse of a second constant current source IB to generate a second multiplier output current $\{[I(c)]^3/(IA*IB)\}$, at block 535.

It is noted that, in some example sequences, the method 500 may optionally include factoring I(c) by a factor N in one or more branches of a sequence of current mirrors to generate one or more factored versions of multiplier current [N*I(c)]. In such case, the method 500 may include applying the factored version of multiplier current(s) [N*I(c)] to one or more inputs associated with the first or second multipliers.

The method 500 further includes subtracting each first multiplier output current $\{[I(c)]^2/IA\}$ and each second multiplier output current $\{[I(c)]^3/(IA*IB)\}$ from the corresponding linear electrical current I(c) at a summing junction, at block 545. The latter operation generates a set of output currents I_OUT(c) as the one-half sinusoidal electrical drive current. The method 500 includes converting I_OUT(c) to a set of voltages V_OUT(c) to form a reference voltage waveform, at block 547. The method 500 also includes converting V_OUT(c) to a full sinusoidal waveform motor driver winding current, at block 548, and driving the motor driver winding using the motor driver current waveform, at block 550.

It is noted that some versions of the method 500 may include a calibration or tuning routine (not shown in FIG. 5) to determine the values of constant current sources IA and IB. For several values of I(c), the method 500 may include adjusting a magnitude of the constant current source IA or the constant current source IB. IA and/or IB are adjusted using a curve-fitting method to generate a version of the one-half sinusoidal electrical drive current I_OUT(c) with a smallest deviation from a mathematically-derived sinusoidal waveform of the same period and amplitude.

The method 500 may continue at block 555 with determining whether the DAC code is incrementing. If so, the method 500 may further include determining whether a maximum DAC code value (e.g., 255 for an 8-bit example DAC) has been reached, at block 560. If not, the method 500 may continue with incrementing the DAC code, at block 565, and continuing with the generation of another sinusoidal output current value beginning at block 515. If the maximum DAC code has been reached, the method 500 continues at block 570 with decrementing the DAC code and continuing in a decrementing state at block 515.

If the DAC is determined to be in a decrementing state at block 555, the DAC code is decremented, at block 575. The method 500 then determines if the DAC code is less than zero, at block 580. If not, the method 500 continues at block 515 to begin generating an additional I_OUT(c) value. If the value of the DAC code is determined to be less than zero at block 580, the method 500 ends the generation of a one-half sinusoidal waveform, at block 585.

It is noted that the method 500 generates a sinusoidal-shaped electric motor winding driver current. Some motors (e.g., a bipolar stepper motor) may utilize two motor windings, each to be driven by a sinusoidal current waveform that is 90 degrees out of phase with the other current waveform. Said differently, one of the current waveforms is a sine current and the other is a cosine current. Consequently, a method (not shown in FIG. 5) similar to the method 500 may operate in parallel with the method 500 to generate the cosine current for the second motor winding. The parallel method includes sequencing the DAC to generate a one-half cosine waveform and converting the one-half cosine waveform to a full cosine motor driver current. Operating together in parallel, the two methods 500 include driving each of the two windings of a bipolar stepper motor using two one-half sinusoidal electrical drive currents separated in phase by 90 degrees.

Apparatus, systems and methods described herein may be useful in applications other than driving a bipolar stepper motor. Examples of the apparatus 100, the system 400, and the method 500 are intended to provide a general understanding of the sequences of various methods and the structures of various embodiments. They are not intended to serve as complete descriptions of all elements and features of methods, apparatus and systems that might make use of these example sequences and structures.

The various embodiments may be incorporated into semiconductor analog and digital circuits for use in receptacle power converters, electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), motor vehicles, medical devices (e.g., heart monitor, blood pressure monitor, etc.), set top boxes, and others.

Structures and methods disclosed herein utilize a lower-resolution linear DAC, current multipliers and a summing junction to implement a sinusoidal DAC of much higher resolution than the lower-resolution linear DAC at the waveform peaks. A surprising and unexpected savings of 90% of silicon surface area dedicated to DAC implementation may result.

By way of illustration and not of limitation, the accompanying figures show specific aspects in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The aspects illustrated are described in sufficient detail to enable those skilled in the art to practice the teachings disclosed herein. Other aspects may be used and derived therefrom, such that structural and logical substitutions and changes may be made without departing from the scope of this disclosure. This Detailed Description, therefore, is not to be taken in a limiting sense. The breadth of various aspects is defined by the appended claims and the full range of equivalents to which such claims are entitled.

Such aspects of the inventive subject matter may be referred to herein individually or collectively by the term "invention" merely for convenience and without intending to voluntarily limit this application to any single invention or inventive concept, if more than one is in fact disclosed. Thus, although specific aspects have been illustrated and described herein, any arrangement calculated to achieve the same purpose may be substituted for the specific aspects shown. This disclosure is intended to cover any and all adaptations or variations of various aspects.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A method of digitally creating a one-half sinusoidal electrical drive current, comprising:
    at an input to a linear digital-to-analog converter (DAC) and at regular intervals, presenting a set of input codes in increasing numerical sequence starting with a code to generate a smallest output voltage magnitude V(0) and ending with a code to generate a largest output voltage magnitude ("V(Max_DAC_Code)");
    at the input to the linear DAC and at regular intervals, presenting the set of input codes in decreasing numerical sequence starting with the code to generate V(Max_DAC_Code) and ending with a code to generate V(0), a magnitude of each DAC output voltage referred to as V(DAC_Code) ("V(c)");
    at a transconductance amplifier, converting each V(c) to a corresponding linear electrical current I(c);
    at a first analog multiplier, multiplying a magnitude of each I(c) by itself and by an inverse of a magnitude of a first constant current source IA to generate a first multiplier output current $\{[I(c)]^2/IA\}$;
    at the second analog multiplier, multiplying each first multiplier output $\{[I(c)]^2/IA\}$ by the linear current I(c) and by an inverse of a second constant current source IB to generate a second multiplier output current $\{[I(c)]^3/(IA*IB)\}$;
    at a summing junction, subtracting each first multiplier output current $\{[I(c)]^2/IA\}$ and each second multiplier output current $\{[I(c)]^3/(IA*IB)\}$ from the corresponding linear electrical current I(c) to generate a set of output currents I_OUT(c) as the one-half sinusoidal electrical drive current.

2. The method of claim 1, further comprising:
    driving an electrical motor using the one-half sinusoidal electrical drive current.

3. The method of claim 1, further comprising:
    driving each of two windings of a bipolar stepper motor using two one-half sinusoidal electrical drive currents separated in phase by 90 degrees.

4. The method of claim 1, further comprising:
    at a sequence of current mirrors, factoring I(c) in at least one output branch of the sequence of current mirrors by a factor N to generate a factored version of multiplier current [N*I(c)]; and applying the factored version of multiplier current [N*I(c)] to at least one of the inputs associated with the first or second multipliers.

5. The method of claim 1, further comprising:
for a plurality of values of I(c), adjusting a magnitude of at least one of the first constant current source IA or the second constant current source IB using a curve-fitting method to generate a version of the one-half sinusoidal electrical drive current I_OUT(c) with a smallest deviation from a mathematically-derived sinusoidal waveform of the same period and amplitude.

6. The method of claim 1, further comprising:
converting the one-half sinusoidal waveform from an electrical current to a reference voltage waveform; and
generating a motor-driver current using the reference voltage waveform.

7. The method of claim 1, further comprising:
sequencing the DAC to generate a one-half cosine waveform.

8. A one-half sinusoidal driver apparatus, comprising:
a first analog current multiplier to sequentially accept two sets of linearly time-related analog currents I(c), each of increasing magnitude over a period of time from zero to a maximum magnitude and then decreasing magnitude over an equal period of time from the maximum magnitude to zero, the first current multiplier to multiply a magnitude of each I(c) by itself and by an inverse of a magnitude of a first constant current source IA to generate a first multiplier output current $\{[I(c)]^2/IA\}$ corresponding to each I(c);
a second analog current multiplier coupled to the first analog current multiplier to multiply each first multiplier output current $\{[I(c)]^2/IA\}$ by each linear current I(c) and by an inverse of a magnitude of a second constant current source IB to generate a second multiplier output current $\{[I(c)]^3/(IA*IB)\}$; and
a summing junction coupled to the first and second analog current multipliers to subtract each first multiplier output current $\{[I(c)]^2/IA\}$ and each second multiplier output current $\{[I(c)]^3/(IA*IB)\}$ from the corresponding linear current I(c) to generate a set of output currents I_OUT(c) as a one-half sinusoidal electrical drive current.

9. The apparatus of claim 8, further comprising:
a linear digital-to-analog converter (DAC) communicatively coupled to the first analog current multiplier to accept a set of input codes in increasing numerical sequence starting with a code to generate a smallest output voltage magnitude V(0) and ending with a code to generate a largest output voltage magnitude ("V(Max_DAC_Code)") and subsequently presenting the set of input codes in decreasing numerical sequence starting with the code to generate V(Max_DAC_Code) and ending with the code to generate V(0), each code presented at an equal time period from a previously-presented code, a magnitude of each DAC output voltage referred to as V(DAC_Code) ("V(c)").

10. The apparatus of claim 9, the linear DAC chosen from a group consisting of a string ladder DAC and a thermometer DAC.

11. The apparatus of claim 9, the linear DAC consisting of an 8-bit DAC to generate 256 voltage levels.

12. The apparatus of claim 9, further comprising:
a quadrant sequencer coupled to inputs of the linear DAC to generate each of the set of input codes to the DAC at equally-spaced times.

13. The apparatus of claim 9, further comprising:
a transconductance amplifier coupled to an output of the linear DAC to convert each V(c) to the corresponding linear electrical current I(c).

14. The apparatus of claim 8, further comprising:
a current mirror communicatively coupled to the first and second current multipliers to generate current inputs to the first and second analog current multipliers.

15. The apparatus of claim 8, further comprising:
a current-to-voltage converter coupled to the summing junction to convert each I_OUT(c) to a corresponding output voltage V_OUT(c).

16. The apparatus of claim 15, further comprising:
a tuning module communicatively coupled to the constant current sources IA and IB and to the current-to-voltage converter to compare a plurality of magnitudes of V_OUT(c) to corresponding values from a mathematically-determined sinusoidal waveform of a desired periodicity and maximum magnitude and to adjust the first and second constant current sources IA and IB to curve-fit a shape of V_OUT(c) to the mathematically-determined sinusoidal waveform.

17. The apparatus of claim 8, the first analog current multiplier further comprising:
a base-coupled pair of NPN bipolar transistors collector-coupled to a positive voltage rail;
an input NPN bipolar transistor to receive each value of analog input current I(c) at a collector terminal, the collector terminal also coupled to the bases of the base-coupled pair of bipolar transistors, an emitter terminal of the input bipolar transistor coupled to a ground rail, and a base terminal of the input bipolar transistor coupled to an emitter terminal of a first one of the base-coupled pair of bipolar transistors;
an input current source I(c) coupled between the emitter terminal of the first one of the base-coupled pair of bipolar transistors and the ground rail;
an output NPN bipolar transistor base-coupled to an emitter terminal of a second one of the base-coupled pair of bipolar transistors, an emitter terminal of the output bipolar transistor coupled to the ground rail and a collector terminal of the output bipolar transistor to provide an output from the first current multiplier; and
a tuned constant-current source IA coupled between the emitter terminal of the second one of the base-coupled pair of bipolar transistors and the ground rail.

18. The apparatus of claim 8, the second analog current multiplier further comprising:
a base-coupled pair of NPN bipolar transistors collector-coupled to a positive voltage rail;
an input NPN bipolar transistor to receive each value of analog input current I(c) at a collector terminal, the collector terminal also coupled to the bases of the base-coupled pair of bipolar transistors, an emitter terminal of the input bipolar transistor coupled to a ground rail, and a base terminal of the input bipolar transistor coupled to an emitter terminal of a first one of the base-coupled pair of bipolar transistors;
an input current source I(c) coupled between the emitter terminal of the first one of the base-coupled pair of bipolar transistors and the ground rail;
an output NPN bipolar transistor base-coupled to an emitter terminal of a second one of the base-coupled pair of bipolar transistors, an emitter terminal of the output bipolar transistor coupled to the ground rail and a collector terminal of the output bipolar transistor to provide an output from the first current multiplier; and a tuned constant-current source IB coupled between the emitter terminal of the second one of the base-coupled pair of bipolar transistors and the ground rail.

19. A system for driving a stepper motor winding, comprising:
- a first analog current multiplier to sequentially accept a set of linearly time-related analog currents I(c) of increasing magnitude over a period of time from zero to a maximum magnitude and then decreasing magnitude over an equal period of time from the maximum magnitude to zero, the first current multiplier to multiply a magnitude of each I(c) by itself and by an inverse of a magnitude of a first constant current source IA to generate a first multiplier output current $\{[I(c)]^2/IA\}$ corresponding to each I(c);
- a second analog current multiplier coupled to the first analog current multiplier to multiply each first multiplier output current $\{[I(c)]^2/IA\}$ by each linear current I(c) and by an inverse of a magnitude of a second constant current source IB to generate a second multiplier output current $\{[I(c)]^3/(IA*IB)\}$;
- a summing junction coupled to the first and second analog current multipliers to subtract each first multiplier output current $\{[I(c)]^2/IA\}$ and each second multiplier output current $\{[I(c)]^3/(IA*IB)\}$ from the corresponding linear current I(c) to generate a set of output currents I_OUT(c) as a one-half sinusoidal electrical drive current;
- a current-to-voltage converter coupled to the summing junction to convert each I_OUT(c) to a corresponding output voltage V_OUT(c).
- a sine phase sequencer and current driver module coupled to the current-to-voltage converter to convert the resulting sinusoidal voltage waveform to a sinusoidal driver current and to reverse a polarity of each one-half sinusoidal interval (180 degrees) of the driver current to generate a full positive and negative-going sinusoidal driver current.

20. The system of claim 19, further comprising:
- a bipolar stepper motor communicatively coupled to the sine phase sequencer and current driver, a sinusoidal winding of the bipolar stepper motor to receive the sinusoidal driver current;
- a one-half cosine driver apparatus to generate a cosine-shaped V_OUT(c);
- a cosine phase sequencer and current driver module coupled to the one-half cosine driver apparatus to convert the resulting cosine voltage waveform to a cosine driver current and to reverse a polarity of the cosine driver current each one-half cosine interval (180 degrees) to generate a full positive and negative-going cosine driver current; and
- a cosine winding of the bipolar stepper motor to receive the cosine driver current.

* * * * *